(12) United States Patent
Terletzki et al.

(10) Patent No.: US 7,173,473 B2
(45) Date of Patent: *Feb. 6, 2007

(54) LEVEL-SHIFTING CIRCUITRY HAVING "HIGH" OUTPUT IMPEDANCE DURING DISABLE MODE

(75) Inventors: Hartmud Terletzki, Pleasant Valley, NY (US); Gerd Frankowsky, Höhenkirchen-Sipyertsbrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/041,464

(22) Filed: Jan. 24, 2005

(65) Prior Publication Data
US 2005/0122156 A1    Jun. 9, 2005

Related U.S. Application Data

(63) Continuation of application No. 09/659,872, filed on Sep. 13, 2000, now Pat. No. 6,853,233.

(51) Int. Cl.
  *H03L 5/00* (2006.01)
(52) U.S. Cl. .......................... 327/333; 326/58; 326/68; 326/81
(58) Field of Classification Search ................ 327/333, 327/108–112; 326/21–28, 63–68, 56–58, 326/80–83; 307/412
See application file for complete search history.

(56) References Cited

U.S. PATENT DOCUMENTS

| 4,216,930 | A |   | 8/1980  | Stewart |
| 4,574,273 | A |   | 3/1986  | Atsumi et al. |
| 4,656,373 | A |   | 4/1987  | Plus |
| 4,707,623 | A |   | 11/1987 | Bismarck |
| 4,820,941 | A |   | 4/1989  | Dolby et al. |
| 5,128,560 | A |   | 7/1992  | Chern et al. |
| 5,151,616 | A |   | 9/1992  | Komuro |
| 5,341,045 | A | * | 8/1994  | Almulla ........................ 326/68 |
| 5,723,987 | A |   | 3/1998  | Ronen |
| 5,739,700 | A |   | 4/1998  | Martin |
| 5,748,024 | A |   | 5/1998  | Takahashi et al. |
| 5,973,549 | A | * | 10/1999 | Yuh ............................ 327/541 |

(Continued)

FOREIGN PATENT DOCUMENTS

EP    0439149 B1    3/1996

(Continued)

*Primary Examiner*—Timothy P. Callahan
*Assistant Examiner*—William Hernandez
(74) *Attorney, Agent, or Firm*—Slater & Matsil, L.L.P.

(57) ABSTRACT

A level shifting circuit includes a level-shifting section responsive to an input logic signal, which varies between a first voltage level (e.g., ground) and a second voltage level (e.g., 2.1V). The level-shifting section provides an output logic signal at an output terminal. The output logic signal varies between the first voltage level and a third voltage level (e.g., 2.5V). The circuit also includes an enable/disable section with a first portion coupled between the level shifting section and a first reference voltage node (e.g., ground) and a second portion coupled between the level shifting section and the third reference voltage node. The enable/disable section causes the output terminal to be placed at a relatively high output impedance condition independent of the logic state of the input logic signal in response to a disable mode indication from an enable/disable signal.

25 Claims, 2 Drawing Sheets

U.S. PATENT DOCUMENTS

| | | |
|---|---|---|
| 6,020,762 A | 2/2000 | Wilford |
| 6,147,511 A | 11/2000 | Patel et al. |
| 6,181,165 B1 | 1/2001 | Hanson et al. |
| 6,307,397 B1 | 10/2001 | Mueller et al. |
| 6,313,663 B1 | 11/2001 | Mueller et al. |
| 6,459,300 B1 | 10/2002 | Terletzki |
| 6,501,298 B1 | 12/2002 | Terletzki |
| 6,693,469 B2 * | 2/2004 | Prodanov .................... 327/108 |

FOREIGN PATENT DOCUMENTS

| | | |
|---|---|---|
| EP | 0942535 A1 | 9/1999 |

* cited by examiner

LEVEL-SHIFTING CIRCUITRY HAVING "HIGH" OUTPUT IMPEDANCE DURING DISABLE MODE

This is a continuation of U.S. application Ser. No. 09/659,872, filed Sep. 13, 2000 and now U.S. Pat. No. 6,853,233, which application is hereby incorporated herein by reference.

TECHNICAL FIELD

This invention relates generally to level-shifting circuitry.

BACKGROUND

As is known in the art, level-shifting circuitry is used to shift lower voltage signal levels to higher voltage signal levels. One example of such circuit is shown in FIG. 1. Such circuit 9 is formed on a semiconductor chip and includes a pair of N type Metal Oxide Semiconductor Field Effect Transistors (MOSFETs) $N_1$ and $N_2$ and a pair of P type MOSFETs $P_1$ $P_2$ arranged as shown. The P type MOSFETs have the bulk silicon connected to an external +2.5 volt power source. The N type MOSFETs have the bulk silicon connected to ground. The N type MOSFET $N_1$ is a low threshold voltage transistor. The gate of transistor $N_1$ is connected to an internal +2.1 volt source. The input voltage (IN) is a logic-signal having logic 1, here represented by +2.1 volts or a logic 0 state, here represented by ground potential. Here, the level-shifter also provides an inversion in the logic state of the input signal as well as shifting the input signal logic 1 state from +2.1 volts to a higher voltage output signal logic 1 state, here +2.5 volts. Thus, in operation, when the input voltage is logic 0, transistors $N_1$, and $P_2$ are "on" and transistors $P_1$ and $N_2$ are "off", thereby providing a logic 1, here a +2.5 volt level, at the output OUT. Thus, the input logic 1 condition of a +2.1 volt input signal has been shifted to a +2.5 volt output logic 1. On the other hand, when the input voltage IN is logic 1 (i.e., here +2.1 volts), transistors $N_1$, and $P_2$ are "off" and transistors $P_1$ and $N_2$ are "on", thereby providing ground potential (i.e., an output logic 0) at the output OUT.

SUMMARY OF THE INVENTION

In accordance with the present invention, level-shifting circuitry is provided having a level-shifting section responsive to an input logic signal. The input logic signal has a first voltage level representative of a first logic state or a second voltage level representative of a second logic state. The level-shifting section provides an output logic signal at an output terminal having a third voltage level representative of the first logic state of the input logic signal. The level-shifting circuitry also includes an enable/disable section responsive to an enable/disable signal for placing the output terminal at a relatively high output impedance condition independent of the logic state of the input signal during a disable mode. In one embodiment, the level-shifting section includes: an input transistor having a control electrode, a first electrode coupled to the input logic signal, and a second electrode.

An output pair of serially coupled complementary type transistors is provided. A first one of the pair of transistors has a first electrode coupled to a source of the third voltage level through a first switching transistor and a control electrode coupled to the second electrode of the input transistor. (It should be noted that in the case of a FET, the terms first and second electrode refer to source and drain electrodes, it being understood that while each transistor has a source and drain electrode, the terms may be used interchangeably. Further, in the case of a FET, the term control electrode refers to the gate electrode). A junction between the output pair of transistors provides an output terminal for the level-shifting circuitry. The junction provides the output terminal. A control electrode of the second one of the pair of transistors is connected to the first electrode of the input transistor. The second one of the pair of transistors has a second electrode coupled to the second voltage level through a second switching transistor. The first and second switching transistors are fed by the enable/disable signal.

In one embodiment, the level-shifting section includes an additional transistor. The additional transistor has a control electrode connected to the junction, a first electrode coupled to the source of the third voltage level through the first switching transistor and a second electrode connected to the second electrode of the input transistor. In one embodiment, the input transistor and the additional transistor are of opposite conductivity type.

In one embodiment, the enable/disable circuit includes an inverter fed by the enable/disable signal, such inverter having an output coupled to the control electrode of the first switching transistor.

In one embodiment, the inverter is powered by a source of the first voltage level and the enable/disable signal operates between the first and second voltages. In such embodiment, the inverter comprises a level shifter for shifting the level of the enable/disable signal from the first voltage level to the third voltage level and for feeding such third voltage level to the control electrode of the first switching transistor to placing the first switching transistor to a non-conducting condition during the disable mode.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

Figure 2:
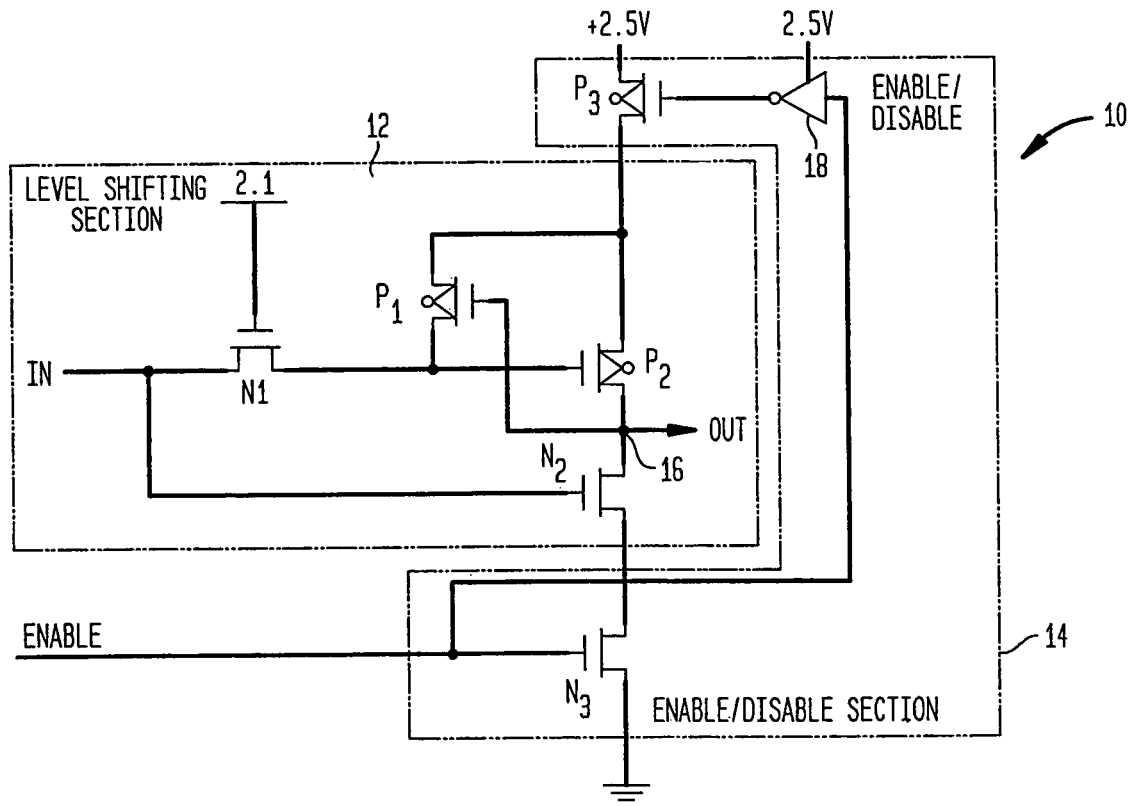
FIG. 2 is a. schematic diagram of a level-shifting circuit according to the invention.

Referring now to FIG. 2, level-shifting circuitry 10 is shown to include: a level-shifting section 12 responsive to an input logic signal IN and an enable/disable section 14 fed by an enable/disable signal ENABLE. The input logic signal IN has a first voltage level, here +2.1 volts representative of a first input logic state, here logic 1, and a second voltage level, here ground, representative of a second input logic state, here logic 0.

The level-shifting section 10 provides an output logic signal at output terminal OUT. The output logic signal at the output terminal OUT has a third voltage level, here +2.5 volts representative of the first output logic state, here logic 1, or the second voltage level, here ground, representative of the second output logic state, here logic 0. Here, during the enable mode (to be described hereinafter), in response to the input logic signal IN having an input logic 1 state (i.e., +2.1 volts), the output logic signal at output terminal OUT will be the ground thereby representing an output logic 0 state. On the other hand, during the enable mode, in response to the input logic signal IN having an input logic 0 state, here ground, the output logic signal at the output terminal OUT will be the third voltage level +2.5 volts thereby representing an output logic 1 state. During a disable mode, the enable/disable section 14 places the output terminal OUT at a relatively high impedance condition independent of the logic state of the input logic signal IN. By high impedance it is meant that substantially little, or no current, passes though the output terminal OUT.

More particularly, the level-shifting section 12 includes an input transistor $N_1$ having a control, here gate, electrode coupled to a +2.1 volt supply, a first electrode coupled to the input logic signal IN, and a second electrode. An output pair of serially coupled complementary type transistors, i.e., P type MOSFET $P_2$ and N type MOSFET $N_2$, is provided. A first one of the pair of transistors $P_2$ has a first electrode coupled to a source, not shown, of the third voltage level (+2.5 volts) through a first switching transistor P type MOSFET $P_3$ and a control electrode coupled to the second electrode of the input transistor $N_1$. A junction 16 between the output pair of transistors $P_2$, $N_2$ provides the output terminal OUT for the level-shifting circuitry 10. A control electrode of the second one of the pair of transistors $N_2$ is connected to the first electrode of the input transistor $N_1$. The second one of the pair of transistors $N_2$ has a second electrode coupled to the second voltage level, here ground, through a second switching transistor $N_3$. The first and second switching transistors P-type MOSFET $P_3$ and N type MOSFET $N_3$ are fed by the enable/disable signal ENABLE, the transistor $P_3$ being coupled to the enable/disable signal ENABLE via an inverter 18, as shown. The level-shifting section 12 includes an additional transistor P type MOSFET $P_1$.

The additional transistor $P_1$ has a control electrode connected to the junction 16, a first electrode coupled to the source of the third voltage level +2.5 through the first switching transistor $P_3$ and a second electrode connected to the second electrode of the input transistor $N_1$. The input transistor $N_1$ and the additional transistor $P_1$ are of opposite conductivity type.

The enable/disable circuit 14 includes an inverter 18 fed by the enable/disable signal ENABLE. The inverter 18 having an output coupled to the control electrode of the first switching transistor $P_3$. The inverter 18 is powered by a source, not shown, of the third voltage level, +2.5 volts. The control electrode of the input transistor N, is coupled to the source of the first voltage level +2.1.

In operation, during the disable mode, the enable/disable signal ENABLE is logic 0, here a voltage at ground. In the disable mode, the output of the inverter 18 is at the third voltage i.e., +2.5 volts. Such +2.5 volts turns transistors $P_3$ and $N_3$ "off" thereby placing the output terminal OUT in a high impedance condition independent of the logic state of the input logic signal IN.

During the enable mode, the enable/disable signal ENABLE is logic 1, here the third voltage level, +2.5 volts. The output of inverter 18 is at ground. Thus, transistors $N_3$ and $P_3$ are "on" independent of the logic state of the input logic signal IN. In such condition, in response to the input logic signal IN having an input logic 0 state, here ground, the output logic signal at the output terminal OUT will be +2.5 volts thereby representing output logic 1 state.

More particularly, in the enable mode, the enable/disable signal ENABLE is a logic 1, here the third voltage level, +2.5 volts. In such enable mode, if the input logic signal IN is a logic 0, here ground, transistors $N_1$ and $P_2$ turn "on" and transistors $N_2$ and $P_1$ turn "off" thereby producing the third voltage level, +2.5 volts, at the junction 16. The third voltage level (+2.5 volts), here output logic 1, is coupled to the output terminal OUT because transistor $N_2$ is "off." On the other hand, if during the enable mode the input logic signal IN is logic 1, here +2.1 volts, transistors $N_1$, $P_2$ turn "off" while transistors $N_2$ and $P_1$ turn "on" thereby driving junction 16 to ground. This ground, i.e., output logic 0 state appears at the output terminal OUT because transistor P2 is "off."

It is noted that the operation described above, the inverter 18 is powered by the source of the third voltage level +2.5 volts and thus, the enable/disable signal ENABLE must be at +2.5 volts during the enable mode. Here, the source of the +2.5 volts is an external voltage source. In some applications it might be desirable to use the internal source of the first voltage level, +2.1 volts for generating the enable mode condition of the enable/disable signal ENABLE. In such application, an alternative level-shifting circuitry is shown in FIG. 3.

Figure 1:
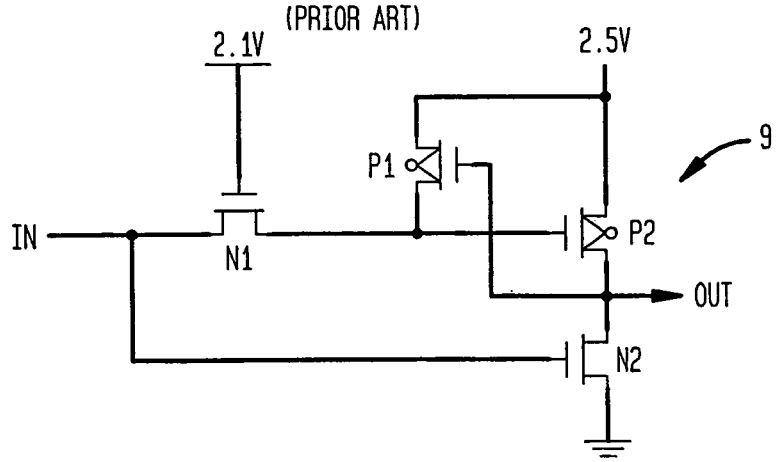
FIG. 1 is a schematic diagram of a level-shifting circuit according to the PRIOR ART.
Figure 3:
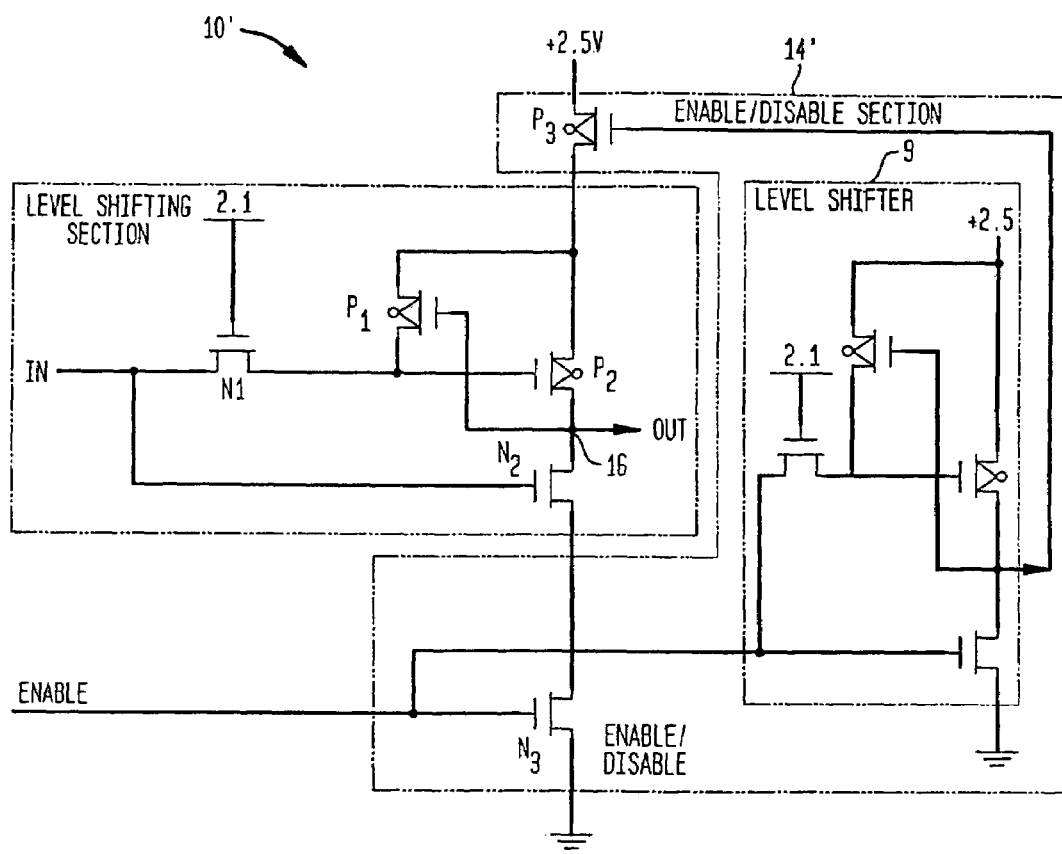
FIG. 3 is a. schematic diagram of a level-shifting circuit according to the invention.

Thus, referring to FIG. 3, the level-shifting circuitry 10 is shown where the inverter 18 of FIG. 2 is replaced with an inverter which also provides level-shifting. More particularly, the inverter 18 of FIG. 2 is provided by the level-shifting circuitry 9 described above in connection with FIG. 1. The inverter/level shifter 9 includes a level shifter and thus shifts the level of the enable/disable signal ENABLE from the first voltage level +2.1 to the third voltage level +2.5 and feeds such third voltage level +2.5 to the control electrode of the first switching transistor $P_3$ to place the first switching transistor $P_3$ to a non-conducting (i.e., "off") condition during the disable mode. More particularly, the inverter/level-shifter 9 is here the level-shifting circuitry 9 shown and described above in connection with FIG. 1, here however, the level-shifting circuitry of FIG. 1 is fed by the enable/disable signal ENABLE and not the input logic signal IN, as in FIG. 1. Thus, in the disable mode, here again the output terminal is at a high output impedance independent of the logic state, of the input logic signal IN.

A number of embodiments of the invention have been described. Nevertheless, it will be understood that various modifications may be made without departing from the spirit and scope of the invention. Accordingly, other embodiments are within the scope of the following claims.

What is claimed is:

1. A level shifting circuit comprising:
  a first reference voltage node carrying a voltage at a first voltage level;
  a second reference voltage node carrying a voltage at a second voltage level, the second voltage level being different than the first voltage level;
  a third reference voltage node carrying a voltage at a third voltage level, the third voltage level being different than the first voltage level and the second voltage level;
  an input node to receive an input signal, the input signal discretely switching between the first voltage level and the second voltage level;
  a first n-channel transistor having a first source/drain region, a second source/drain region and a gate, the gate being coupled to the input node;

a second n-channel transistor having a first source/drain region coupled to the second source/drain region of the first n-channel transistor, a second source/drain region coupled to the second reference voltage node and a gate coupled to a first enable signal node;

a first p-channel transistor having a first source/drain region coupled to the first source/drain region of the first n-channel transistor, a second source/drain region and a gate coupled to the input node;

a second p-channel transistor having a first source/drain region coupled to the second source/drain region of the first p-channel transistor, a second source/drain region coupled to the third reference voltage node and a gate coupled to a second enable signal node; and an output node coupled to the first source/drain region of the first n-channel transistor and the first source/drain region of the first p-channel transistor, the output node carrying an output signal, the output signal discretely switching between the third voltage level and the second voltage level.

2. The circuit of claim 1 wherein:

the second reference voltage node comprises a ground node and the second voltage level comprises ground;

the third reference voltage node comprises a VDD node and the third voltage level comprises VDD; and the first reference voltage node comprises a reduced voltage level node and the first voltage level comprises a reduced voltage level, the reduced voltage level being greater than ground but less than VDD.

3. A level shifting circuit comprising:

a first reference voltage node carrying a voltage at a first voltage level;

a second reference voltage node carrying a voltage at a second voltage level, the second voltage level being different than the first voltage level;

a third reference voltage node carrying a voltage at a third voltage level, the third voltage level being different than the first voltage level and the second voltage level, wherein the second reference voltage node comprises a ground node and the second voltage level comprises ground, wherein the third reference voltage node comprises a VDD node and the third voltage level comprises VDD, and wherein the first reference voltage node comprises a reduced voltage level node and the first voltage level comprises a reduced voltage level, the reduced voltage level being water than round but less than VDD;

an input node to receive an input signal, the input signal varying between the first voltage level and the second voltage level;

a first n-channel transistor having a first source/drain region, a second source/drain region and a gate, the gate being coupled to the input node;

a second n-channel transistor having a first source/drain region coupled to the second source/drain region of the first n-channel transistor, a second source/drain region coupled to the second reference voltage node and a gate coupled to a first enable signal node;

a first p-channel transistor having a first source/drain region coupled to the first source/drain region of the first n-channel transistor, a second source/drain region and a gate coupled to the gate of the first n-channel transistor;

a second p-channel transistor having a first source/drain region coupled to the second source/drain region of the first p-channel transistor, a second source/drain region coupled to the third reference voltage node and a gate coupled to a second enable signal node:

a third n-channel transistor having a first source/drain region coupled to the input node, a second source/drain region coupled to the gate of the first p-channel transistor, and a gate coupled to the first reference voltage node; and an output node coupled to the first source/drain region of the first n-channel transistor and the first source/drain region of the first p-channel transistor, the output node carrying an output signal, the output signal varying between the third voltage level and the second voltage level.

4. The circuit of claim 3 and further comprising a third p-channel transistor having a first source/drain region coupled to the gate of the first p-channel transistor, a second source/drain region coupled to the second source/drain region of the first p-channel transistor, and a gate coupled to the first source/drain region of the first p-channel transistor.

5. The circuit of claim 4 wherein the first enable signal node carries a first enable signal and wherein the second enable signal node carries a second enable signal and wherein the first enable signal is an inverted version of the second enable signal.

6. The circuit of claim 5 and further comprising an inverter having an input and an output, the input coupled to the first enable signal node and the output coupled to the second enable signal node.

7. The circuit of claim 6 wherein the inverter comprises:

a fourth n-channel transistor with a first source/drain region coupled to the second enable signal node, a second source/drain region coupled to the first voltage level reference node, and a gate coupled to the first enable signal node; and a fourth p-channel transistor with a first source/drain region coupled to the second enable signal node, a second source/drain region coupled to the third reference voltage node, and a gate coupled to the first enable signal node.

8. The circuit of claim 7 wherein the inverter further comprises:

a fifth n-channel transistor with a first source/drain region coupled to the first enable signal node, a second source/drain region coupled to gate of the fourth p-channel transistor, and a gate coupled to the first voltage level reference node; and a fifth p-channel transistor with a first source/drain region coupled to the gate of the fourth p-channel transistor, a second source/drain region coupled to the third reference voltage node, and a gate coupled to first source/drain region of the fourth p-channel transistor.

9. The circuit of claim 2 wherein a signal carried at the first enable signal node is an inverted version of a signal carried at the second enable signal node.

10. The circuit of claim 9 and further comprising an inverter coupled between the first enable signal node and the second enable signal node, the inverter including a level shifting circuit.

11. The circuit of claim 1 wherein the third voltage level is greater than the first voltage level.

12. The circuit of claim 11 wherein the third voltage level is +2.5 volts and the first voltage level is +2.1 volts.

13. A level shifting circuit comprising:

a level-shifting section responsive to an input logic signal, the input logic signal discretely switching between a first voltage level and a second voltage level, the level-shifting section providing an output logic signal at an output terminal thereof, the output logic signal discretely switching between the first voltage level and a third voltage level, the third voltage level being different than the second voltage level;

a first reference voltage node carrying a voltage at the first voltage level;

a third reference voltage node carrying a voltage at the third voltage level; and an enable/disable section including a first portion coupled between the output terminal and the first reference voltage node and a second portion coupled between the output terminal and the third reference voltage node, the enable/disable section being responsive to an enable/disable signal, the enable/disable section causing the output terminal to be placed at a relatively high output impedance condition in response to a disable mode indication from the enable/disable signal.

14. The circuit of claim 13 wherein the first voltage level and the third voltage level are representative of a first logic state and wherein the first voltage level and the second voltage level are representative of a second logic state.

15. The circuit of claim 13 wherein the level-shifting section comprises:

a first transistor with a current pat coupled between the third reference voltage node and the output terminal; and a second transistor with a current path coupled between the output terminal and the first reference voltage node.

16. The circuit of claim 15 wherein the enable/disable section comprises:

a third transistor with a current path coupled in series the current path of the first transistor, the current path of the third transistor coupled between the third reference voltage node and the first transistor; and a fourth transistor with a current path coupled in series the current path of the second transistor, the current path of the fourth transistor coupled between the first reference voltage node and the second transistor.

17. The circuit of claim 16 wherein both the third and fourth transistors are rendered conductive when the enable/disable signal indicates that the level shifting circuit is in an enable mode and wherein both the third and fourth transistors are rendered non-conductive when the enable/disable signal indicates that the level shifting circuit is in the disable mode.

18. The circuit of claim 13 wherein the first portion of the enable/disable section comprises a first switch between the level-shifting section and the first reference voltage node and wherein the second portion of the enable/disable section includes a second switch coupled between the level-shifting section and the third reference voltage node.

19. The circuit of claim 18 and further comprising an inverter coupled between a control terminal of the first switch and a control terminal of the second switch, wherein the inverter includes an input coupled to the control terminal of the first switch and an output coupled to the control terminal of the second switch, and wherein the inverter includes a level shifter coupled to the third reference voltage node and to a voltage node at the first voltage level.

20. The circuit of claim 18 wherein the first and second switches comprise MOS transistors.

21. The circuit of claim 1, further comprising a third n-channel transistor having a first source/drain region coupled to the input node, a second source/drain region coupled to the gate of the first p-channel transistor, and a gate coupled to the first reference voltage node.

22. The circuit of claim 1, wherein the first voltage level represents a first logic value and wherein the third voltage level represents the first logic value and the second voltage level represents the second logic value.

23. The circuit of claim 13, wherein the first voltage level represents a first logic value, wherein the second voltage level represents a second logic value and wherein the third voltage level represents the second logic value.

24. The circuit of claim 13, wherein the first portion of the enable/disable section is coupled between the level-shifting section and the first reference voltage node and the second portion of the enable/disable section is coupled between the level-shifting section and the third reference voltage node.

25. The circuit of claim 13, wherein the enable/disable section causes the output terminal to be placed at the relatively high output impedance condition independent of the logic state of the input logic signal.

* * * * *